(12) United States Patent
Beinlich

(10) Patent No.: US 12,744,545 B2
(45) Date of Patent: Sep. 22, 2026

(54) N-BIT DIGITAL-TO-ANALOGUE CONVERTER AND MIXED-SIGNAL MICROCONTROLLER

(71) Applicant: Delta Electronics (Thailand) Public Company Limited, Samutprakarn (TH)

(72) Inventor: Dominik Reinhard Beinlich, Soest (DE)

(73) Assignee: Delta Electronics (Thailand) Public Company Limited, Samutprakarn (TH)

( * ) Notice: Subject to any disclaimer, the term of this patent is extended or adjusted under 35 U.S.C. 154(b) by 217 days.

(21) Appl. No.: 18/798,458

(22) Filed: Aug. 8, 2024

(65) Prior Publication Data

US 2025/0079996 A1 Mar. 6, 2025

Related U.S. Application Data

(60) Provisional application No. 63/538,612, filed on Sep. 15, 2023, provisional application No. 63/536,206, filed on Sep. 1, 2023.

(30) Foreign Application Priority Data

Jun. 18, 2024 (EP) .................................... 24182929

(51) Int. Cl.
*H03M 1/66* (2006.01)

(52) U.S. Cl.
CPC .................................... *H03M 1/66* (2013.01)

(58) Field of Classification Search
CPC ............. H03M 1/66; H03M 1/70; H03K 7/08
See application file for complete search history.

(56) References Cited

U.S. PATENT DOCUMENTS 8,278,899 B2 10/2012 Schafmeister et al.
9,048,863 B2 * 6/2015 Kris ...................... H02M 3/157
9,252,800 B1 2/2016 Park et al.
9,379,621 B1 6/2016 Kalyanaranman et al.
(Continued)

FOREIGN PATENT DOCUMENTS

TW I270255 B 1/2007

OTHER PUBLICATIONS

High-Speed Analog Comparator with Slope Compensation DAC, Microchip Technology Inc., 2017-2018, pp. 553-564.

*Primary Examiner* — Jean B Jeanglaude
(74) *Attorney, Agent, or Firm* — KIRTON McCONKIE; Evan R. Witt

(57) ABSTRACT

The invention relates to an N-bit digital-to-analogue converter with an output voltage range and configured to provide as output an output voltage based on digital data received as input. The N-bit digital-to-analogue converter comprises at least one register, comprising an output data register having at least N bits and M enhancement bits, wherein the N-bit digital-to-analogue converter is configured to store the received digital data in the output data register and in the M enhancement bits; an evaluation logic configured to provide at least one binary evaluation signal derived from the received digital data; and a converter configured to receive the at least one binary evaluation signal, with the converter having access to the output data register and being configured to provide the output voltage based on the output data register and the received at least one binary evaluation signal.

20 Claims, 7 Drawing Sheets

(56) References Cited

U.S. PATENT DOCUMENTS

| | | | | |
|---|---|---|---|---|
| 12,015,344 | B2 * | 6/2024 | Murphy | H02M 1/0009 |
| 12,105,143 | B2 * | 10/2024 | Pedone | H03M 1/785 |
| 2007/0182391 | A1 | 8/2007 | Chapuis et al. | |
| 2014/0167993 | A1 * | 6/2014 | Chiang | H03M 1/089 341/145 |
| 2014/0266833 | A1 | 9/2014 | Kris et al. | |
| 2020/0083794 | A1 | 3/2020 | Bhandarkar et al. | |
| 2020/0119745 | A1 | 4/2020 | Chao | |
| 2022/0368226 | A1 * | 11/2022 | Murphy | H02M 3/157 |

* cited by examiner 16
25
2
3
26
3V
+10A
1.5V
0A
0V
-10A 26
25
3
16
3V
+10A
1.5V
0A
0V
-10A

N-BIT DIGITAL-TO-ANALOGUE CONVERTER AND MIXED-SIGNAL MICROCONTROLLER

CROSS-REFERENCE TO RELATED APPLICATION

This application claims the benefits of U.S. Provisional Application No. 63/536,206 filed on Sep. 1, 2023 and entitled "SLOPE COMPENSATION WITH PEAK CURRENT CONTROL FOR CONVERTER", and U.S. Provisional Application No. 63/538,612 filed on Sep. 15, 2023 and entitled "ENHANCED DAC SLOPE COMPENSATION". This application also claims priority to Europe patent application Ser. No. 24/182,929.0 filed on Jun. 18, 2024. The entire contents of the above-mentioned patent applications are incorporated herein by reference for all purposes.

FIELD OF THE INVENTION

The invention relates to an N-bit digital-to-analogue converter and to a mixed-signal microcontroller for current mode control of a switched-mode power supply.

BACKGROUND OF THE INVENTION

To avoid the occurrence of subharmonic oscillations during current mode control of switched-mode power supplies, it is known in the prior art to apply slope compensation. For peak current mode control of switched-mode power supplies, it is known that without suitable compensation, subharmonic oscillations may occur for duty cycles of a switch of the switched-mode power supply that are greater than 50%. For valley current mode control of switched-mode power supplies, it is known that without suitable compensation, subharmonic oscillations may occur for duty cycles of a switch of the switched-mode power supply that are smaller than 50%.

In the prior art, both analogue and digital current mode control is known. As switched-mode power supplies comprise analogue elements, to carry out digital current mode control, mixed-signal electronics is required that can handle both signals from the analogue and from the digital domain. Typically in the prior art, first an analogue current mode control scheme is developed, and the developed analogue current mode control scheme is then suitably discretised to arrive at a digital current mode control scheme. To move from continuous time to discrete time, the use of the bilinear transform is for example known in the prior art. Digital signals as used in digital current mode control are therefore typically a digital representation of an underlying analogue quantity.

While the actual value range of physical quantities such as currents and voltages in the switched-mode power supply may be mostly restricted to narrow value ranges, analogue current mode control, and hence digital current mode control, may increase the value ranges. As digital-to-analogue converters as known in the prior art and as used in digital current mode control schemes have a resolution which is primarily determined by the output voltage range, the actual range of the encoded physical quantities and the number of available bits, the use of such digital-to-analogue converters decreases resolution in the actual range of interest corresponding to the narrow value ranges as not all of the available bits are used for representing the narrow value ranges. As consequence of the decreased resolution, digital current mode control may perform worse than an underlying current mode control scheme.

A further disadvantage of known digital-to-analogue converters is that they may not be suitable for current mode control of switched-mode power supplies with slope compensation in case current sensors are used that have a voltage offset.

SUMMARY OF THE INVENTION

It is the object of the invention to create a digital-to-analogue converter which mitigates at least some of the disadvantages of digital-to-analogue converters as known in the prior art, in particular of digital-to-analogue converters that are part of mixed-signal microcontrollers for current mode control of switched-mode power supplies.

The solution of the invention is specified by the features of various embodiments of the invention. The invention relates to an N-bit digital-to-analogue converter with an output voltage range between a minimum output voltage and a maximum output voltage and with N being a positive integer, wherein the N-bit digital-to-analogue converter is configured to provide as output an output voltage based on digital data received as input, wherein the N-bit digital-to-analogue converter comprises

- at least one register, with the at least one register comprising an output data register having at least N bits and with the at least one register further comprising M enhancement bits, with M being a positive integer, wherein the N-bit digital-to-analogue converter is configured to store the received digital data in the output data register and in the M enhancement bits;
- an evaluation logic configured to provide at least one binary evaluation signal derived from the received digital data stored in the output data register and in the M enhancement bits, with each binary evaluation signal of the at least one binary evaluation signal having as possible values respectively a first binary evaluation signal value and a second binary evaluation signal value; and
- a converter configured to receive the at least one binary evaluation signal, with the converter having access to the output data register and being configured to provide the output voltage based on the output data register and the received at least one binary evaluation signal.

The N-bit digital-to-analogue converter (N-bit DAC) is configured to map digital input values into analogue output values, which analogue output values lie in an output voltage range between a minimum output voltage and a maximum output voltage. The output voltage range for example may be between ground and a voltage reference $V_{REF}$, or the output voltage range may be between a negative voltage reference $-V_{REF}$ and the voltage reference $V_{REF}$. The N-bit DAC is configured to map digital signals encoded in N bits into the output voltage range, e.g. through equidistant spacing of the $2^N$ possible digital signals encoded by the N bits within the output voltage range, which output voltage range may be, for example, between 0V and $$\frac{(2^N - 1)V_{REF}}{2^N}.$$

The actual output voltage is provided through the converter of the N-bit DAC, which converter may comprise an R-2R ladder network for mapping digital signals into analogue values, for example. The converter may, however, also comprise different means than R-2R ladder networks as known in the prior art for mapping digital signals into analogue output voltages.

The N-bit DAC comprises at least one register. The at least one register comprises an output data register having at least N bits. The at least one register also comprises M enhancement bits. As an example of a further possible register, the N-bit DAC may comprise a shift register. The N-bit DAC may comprise an input pin through which the N-bit DAC may receive serial input data, which serial input data may comprise the digital data received as input, for example. Besides the digital data, the serial input data may comprise further information to control behaviour of the N-bit DAC. The N-bit DAC may also comprise another input pin through which the N-bit DAC may receive a clock signal, which clock signal may determine timing of the N-bit DAC. When receiving the serial input data, the N-bit DAC may first store the received serial input data in the shift register. The N-bit DAC may for example be such that the received serial input data is moved to the shift register on each rising clock edge. Through other trigger signals received by the N-bit DAC through further dedicated input pins, for example, data stored in the shift register may be latched into the output data register and the M enhancement bits. Other implementations for moving the received digital data into the output data register and the M enhancement bits are feasible as well, however.

The at least one register may comprise an enhancement register different from the output data register, which enhancement register may comprise the M enhancement bits. Alternatively, the output data register may comprise the M enhancement bits, i.e. the output data register may comprise at least N+M bits. Having a separate enhancement register that is different from the output data register may provide greater freedom of data processing as the digital data in the enhancement register may be independently changed, for example incremented or decremented, from the digital data in the output data register. In both cases, however, the output data register and the M enhancement bits provide a space for storing binary data on which the evaluation logic of the N-bit DAC may operate, i.e. on which space computation may take place. The output data register and the M enhancement bits may enable an internal representation of an enlarged range of values on which computation may be carried out as compared to the range encoded by the N bits that are converted into the output voltage by the converter.

The output data register and the M enhancement bits on one side and the converter on the other side may be configured such that the digital data stored in the output data register and the M enhancement bits is not directly converted into analogue output voltages by the converter. Instead, the at least one register of the N-bit DAC may comprise a converter register comprising N bits, for example, with the converter operating directly on the converter register, and with the binary data stored in the converter register being used for opening or closing switches of an R-2R ladder network of the converter, for example. The binary data stored in such a converter register may depend on both the digital data stored in the output data register and on the at least one binary evaluation signal provided by the evaluation logic. In case such a converter register is present, the converter may comprise control logic configured to write binary data into the converter register based on the at least one binary evaluation signal and the digital data stored in the output data register.

Alternatively, the converter may also directly operate on the digital data stored in the output data register, i.e. the converter register may not be present. In this case, the converter may comprise control logic which takes into account both the digital data stored in N bits of the output data register and the at least one binary evaluation signal for setting switches of an R-2R ladder network of the converter, for example.

Each binary evaluation signal of the at least one binary evaluation signal abstractly corresponds to a binary decision on whether a property is fulfilled or is not fulfilled by the digital data stored in the output data register and in the M enhancement bits. A possible binary decision is whether the stored digital data is smaller or larger than a threshold, for example. Each binary evaluation signal may therefore have two possible binary evaluation signal values, with one of the two possible values encoding that the stored digital data does not fulfil the property and with the other of the two possible values encoding that the stored digital data fulfils the property. A property may be memoryless, i.e. whether or not the stored digital data processed by the evaluation logic fulfils the respective property may be treated independently of whether previously stored digital data fulfilled the respective property or not. The evaluation logic may also use time-dependent properties, however, i.e. whether or not the stored digital data processed by the evaluation logic fulfils the respective property may depend on whether previously stored digital data fulfilled the respective property or not. For being able to handle such time-dependent properties, the N-bit DAC may comprise an internal storage in which binary evaluation signals may be stored.

Advantageously, the inventive N-bit DAC may therefore receive digital data as input which may not be represented by the N bits, which N bits, together with the output voltage range, may define the output resolution of the N-bit DAC. Through the at least one binary evaluation signal, however, information about the received digital data may be determined and used for potentially influencing the output voltage of the N-bit DAC.

In an embodiment of the N-bit digital-to-analogue converter according to the invention, the minimum output voltage and the maximum output voltage depend on a voltage reference provided to the N-bit digital-to-analogue converter.

In a further embodiment of the N-bit digital-to-analogue converter according to the invention, the number M of enhancement bits is configurable. Advantageously, the range of digital data which may be received as input by the N-bit DAC may thereby be configurable.

In a further embodiment of the N-bit digital-to-analogue converter according to the invention, each binary evaluation signal of the at least one binary evaluation signal is related to a corresponding threshold, wherein the evaluation logic is configured to (i) provide each binary evaluation signal of the at least one binary evaluation signal by comparing the digital data stored in the output data register and in the M enhancement bits to the corresponding threshold and to (ii) subsequently set the binary evaluation signal to the first binary evaluation signal value or to the second binary evaluation signal value based on the comparison.

In a further embodiment of the N-bit digital-to-analogue converter according to the invention, the output data register comprises the M enhancement bits, with the M enhancement bits being continuously appended to the N bits so that the output data register comprises N+M bits for storing the received digital data. The maximum value that thus may be stored in the N+M bits may be $2^{N+M}-1$.

In a further embodiment of the N-bit digital-to-analogue converter according to the invention, the evaluation logic is configured to provide a first binary evaluation signal, with the corresponding first threshold being configurable or being equal to $2^N-1$, and the converter is configured to (i) provide an output voltage corresponding to the configurable first threshold or to $2^N-1$ in case the digital data stored in the output data register and in the M enhancement bits is larger than the configurable first threshold or than $2^N-1$ and to (ii) provide an output voltage based on the digital data stored in the output data register in case the stored digital data is smaller than or equal to the configurable first threshold or to $2^N-1$.

In a further embodiment of the N-bit digital-to-analogue converter according to the invention, the evaluation logic is configured to provide a second binary evaluation signal, with the corresponding second threshold being configurable while being smaller than the first threshold, and wherein the converter is configured to (i) provide an output voltage corresponding to the configurable second threshold in case the digital data stored in the output data register and in the M enhancements bits is smaller than the configurable second threshold and to (ii) provide an output voltage corresponding to the digital data stored in the output data register in case the stored digital data is greater than or equal to the configurable second threshold.

In a further embodiment of the N-bit digital-to-analogue converter according to the invention, the at least one register comprises an enhancement register, which enhancement register comprises the M enhancement bits.

In a second aspect, the invention relates to a mixed-signal microcontroller for current mode control of a switched-mode power supply, wherein the mixed-signal microcontroller comprises (i) a compensation control logic configured to provide a series of digital compensation control values derived from a voltage sense signal, with the voltage sense signal being based on a power supply output voltage of the switched-mode power supply, (ii) a slope compensation logic configured to provide a series of digital slope compensation values, with the series of digital slope compensation values being adapted to the switched-mode power supply, (iii) an N-bit digital-to-analogue converter according to the invention, with the N-bit digital-to-analogue converter configured to receive as input the series of digital compensation control values and the series of digital slope compensation values and to provide as output a control voltage signal, (iv) a comparator, wherein the comparator is configured to compare the control voltage signal to a voltage of a current sense signal, with the current sense signal being based on a current through the switched-mode power supply, and to provide as output a comparator voltage signal, and (v) a drive control logic, wherein the drive control logic is configured to receive as input the comparator voltage signal and to provide as output a drive signal for a switch of the switched-mode power supply.

Current mode control, for example realised as peak current mode control, valley current mode control or emulated current mode control, is a well-known technique used for controlling switched-mode power supplies. A known problem in current mode control of switched-mode power supplies is the occurrence of sub-harmonic oscillations that manifest themselves in alternating wide and narrow pulses. To prevent such sub-harmonic oscillations from occurring, slope compensation is a known technique from the prior art. Current mode control may in general be realised as analogue current mode control or digital current mode control. The mixed-signal microcontroller of the second aspect is designed for digital current mode control.

The mixed-signal microcontroller is configured to control switching behaviour of switches of the switched-mode power supply through its drive control logic. For this purpose, the mixed-signal microcontroller may comprise a pulse-width modulation controller. In case the switched-mode power supply is embodied as a Buck converter, for example, the ratio between the power supply output voltage of the Buck converter to its input voltage ideally corresponds to the duty cycle at which the switch of the Buck converter is operated. Assuming the Buck converter does not comprise a second switch for synchronous rectification but only a diode, the single switch of the Buck converter may be controlled by the mixed-signal microcontroller. This switch may be periodically turned on, thereby enabling current flow through the switch, at a switching frequency. Once the switch is turned on, current through the inductor of the Buck converter starts increasing. Within each switching period, the mixed-signal microcontroller is configured to determine the time at which the switch shall be turned off: current through the inductor of the Buck converter then starts decreasing. More generally, for other type of switched-mode power supplies as well, a switch of the switched-mode power supply may also be periodically turned on at a switching frequency and later turned off during each switching period by the mixed-signal microcontroller.

During steady state operation of the switched-mode power supply, the slope compensation logic may provide the digital slope compensation values in the form of a periodically repeating compensating ramp signal, wherein the slope compensation period of the compensating ramp signal may ideally be close to the switching period of the switched-mode power supply. In general, the type of slope compensation to be used (possible parameters to be set include, inter alia, height of the compensating ramp signal, number of steps per slope compensation period, use of an up-slope or down-slope, duration of a slope compensation period etc.) may depend on the type of switched-mode power supply, on how the switched-mode power supply is to be operated and on the type of current mode control to be used. The configuration of the slope compensation logic is well known from the prior art.

For a Buck converter for which analogue peak current mode control is used, for example, the slope of the analogue compensation signal may be set based on the down-slope of the current through the inductor of the Buck converter, i.e. it may be proportional to the ratio between the power supply output voltage, i.e. the output voltage of the Buck converter, and the inductance of the inductor of the Buck converter. Similarly, for a Boost converter for which analogue peak current mode control is used, for example, the slope of the analogue compensation signal may be set to be proportional to the ratio between (i) the difference between the power supply output voltage, i.e. the output voltage of the Boost converter, and the input voltage of the Boost converter, and (ii) the inductance of the inductor of the Boost converter. Similarly, for a Buck-Boost converter for which analogue peak current control is used, for example, the slope of the analogue compensation signal may be set to be proportional to the ratio between the power supply output voltage, i.e. the output voltage of the Buck-Boost converter, and the inductance of the inductor of the inductor of the Buck-Boost converter. Summarising, for the Buck converter, the Boost converter and the Buck-Boost converter, in case of analogue peak current mode control, the slope of the compensation signal may be set based on the down-slope of the current through the inductor of the respective converter. In case of controlling the Buck converter, the Boost converter or the Buck-Boost converter with analogue valley current mode control, for example, the slope of the compensation signal may be set based on the up-slope of the current through the inductor of the respective converter.

For digital current mode control, instead of these analogue compensation signals, functionally equivalent digital slope compensation values may be provided by the slope compensation logic, which digital slope compensation values may be subtracted from or added to the digital compensation control values. The digital compensation control values may be provided by the compensation control logic at a rate corresponding to the switching frequency of the switched-mode power supply; for a slope compensation period that is smaller than or equal to the switching period, the sequence of steps per slope compensation period may be provided at a higher frequency than the switching frequency and the corresponding clock signal may be provided to the N-bit digital-to-analogue converter as well.

In case the switched-mode power supply is embodied as a Buck converter and the mixed-signal microcontroller is configured to carry out digital peak current mode control, for example, at the N-bit digital-to-analogue converter of the mixed-signal microcontroller, the following operations may be carried out in each switching period: at a beginning of the switching period, a digital compensation control value of the series of digital compensation control values may be provided to the N-bit digital-to-analogue converter and stored in the output data register and in the M enhancement bits. Next, the digital slope compensation values may be one after the other subtracted from the stored digital compensation control value before a next digital compensation control value is provided to the N-bit digital-to-analogue converter; accordingly, the stored digital compensation control value may be gradually decremented.

The N-bit digital-to-analogue converter provides as output a control voltage signal.

Further continuing with the example in which the switched-mode power supply is embodied as a Buck converter and the mixed-signal microcontroller is configured to carry out digital peak current mode control, the comparator of the mixed-signal microcontroller is configured to compare a current sense signal with the control voltage signal. In present example, the current sense signal is based on a peak of the current through the inductor of the Buck converter. To obtain the current sense signal, a resistor or a current transformer may be used, for example. The current sense signal may be provided as input to the mixed-signal microcontroller. Based on the result of this comparison, i.e. the comparator voltage signal, a drive signal for driving the switch of the Buck converter may be determined by the drive control logic of the mixed-signal microcontroller.

For typical operational conditions of a Buck converter, Boost converter or Buck-Boost converter controlled with analogue peak current mode control, for example, the current sense signal may be confined to a narrower range of possible values than the range of values that the analogue compensation signal for analogue slope compensation would traverse within one switching period. The N-bit digital-to-analogue converter of the mixed-signal microcontroller may accordingly be embodied in such a way that the N bits of the N-bit digital-to-analogue converter do not represent the range of values that the analogue compensation signal would traverse within one switching period, but may instead represent the narrower range of the current sense signal, while the N+M bits provided by the output data register together with the M enhancement bits may represent the larger range of values which the analogue compensation signal would traverse within one switching period. Advantageously, the N-bit digital-to-analogue converter of the invention as part of the mixed-signal microcontroller may thereby improve resolution in the narrower range of possible values of the current sense signal, which narrower range of possible values is relevant for the subsequent comparison between the control voltage signal and the current sense signal, while retaining the ability to process values from the larger range of values which the analogue compensation signal would traverse within one switching period. If instead of the N-bit digital-to-analogue converter according to the invention a conventional N-bit digital-to-analogue converter were used, resolution in the relevant range for current mode control would be lower as the N bits would be used for representing the larger range of values which the analogue compensation signal would traverse within one switching period.

For a Buck converter with analogue peak current mode control, for example, the evaluation logic of the N-bit digital-to-analogue converter may provide one binary evaluation signal: if the currently stored digital data in the output data register and the M enhancement bits, which currently stored digital data corresponds to the gradually decremented digital compensation control values, is larger than $2^N-1$, the converter of the N-bit digital-to-analogue converter may provide as output voltage the maximum output voltage; if the currently stored digital data in the output data register and the M enhancement bits is smaller than or equal to $2^N-1$, the converter of the N-bit digital-to-analogue converter may provide as output voltage a voltage in the output voltage range corresponding to the currently stored digital data.

The power supply output voltage of the switched-mode power supply may be provided via a voltage divider to the mixed-signal microcontroller, which mixed-signal microcontroller may comprise an analogue-to-digital converter that samples the fraction of the power supply output voltage provided by the voltage divider. The sampled values may then be provided to a digital filter which digital filter in turn may output the digital compensation control values.

Using a mixed-signal microcontroller for current mode control of a switched-mode power supply may advantageously also enable the use of current sensors for sensing the current in the switched-mode power supply, which current sensors having an offset in their output voltages. Using a mixed-signal microcontroller for current mode control of a switched-mode power supply may advantageously also enable an improved protection of the switched-mode power supply against rapid increases of current in the switched-mode power supply.

In an embodiment of the mixed-signal microcontroller, the mixed-signal microcontroller further comprises an analogue-to-digital converter configured to receive the voltage sense signal as input and to provide as output a digital voltage sense signal to the compensation control logic, and/or the drive control logic comprises a pulse-width modulation controller.

In a further embodiment of the mixed-signal microcontroller, the series of digital slope compensation values are provided in the form of a periodically repeating compensating ramp signal, wherein for each digital compensation control value of the series of digital compensation control values, the microcontroller is configured to load the digital compensation control value into the output data register and the M enhancement bits and to subsequently adapt the loaded digital compensation control value by adding or subtracting the digital slope compensation values of one period of the compensating ramp signal to or from the loaded digital compensation control value before loading a subsequent digital compensation control value of the series of digital compensation control values into the output data register and the M enhancement bits.

In a further embodiment of the mixed-signal microcontroller, the evaluation logic of the N-bit digital-to-analogue converter is configured to provide the at least one binary evaluation signal after each adaptation of the loaded digital compensation control value.

Instead of providing the at least one binary evaluation signal after each adaptation of the loaded digital compensation control value, the at least one binary evaluation signal may also only be provided for a subset of the adapted loaded digital compensation control values.

In a further embodiment of the mixed-signal microcontroller, the mixed-signal microcontroller is configured for peak current mode control, wherein the slope compensation logic is configured to provide a compensating ramp signal with a slope based on a down-slope of an inductor current through an inductor of the switched-mode power supply.

In a further embodiment of the mixed-signal microcontroller, the mixed-signal microcontroller is configured for valley current mode control, wherein the slope compensation logic is configured to provide a compensating ramp signal with a slope based on an up-slope of an inductor current through an inductor of the switched-mode power supply, and wherein the at least one register of the N-bit digital-to-analogue converter comprises an enhancement register, which enhancement register comprises the M enhancement bits.

An N-bit digital-to-analogue converter according to the invention with a separate enhancement register may provide processing flexibility as the enhancement register may be incremented or decremented independently from the output data register.

In a further embodiment of the mixed-signal microcontroller, the mixed-signal microcontroller is configured for current mode control of a buck converter, or for current mode control of a boost converter, or for current mode control of a buck-boost converter.

Other advantageous embodiments and combinations of features come out from the detailed description below and the entirety of the claims.

BRIEF DESCRIPTION OF THE DRAWINGS

The drawings used to explain the embodiments show.

In the figures, the same components are given the same reference signs.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
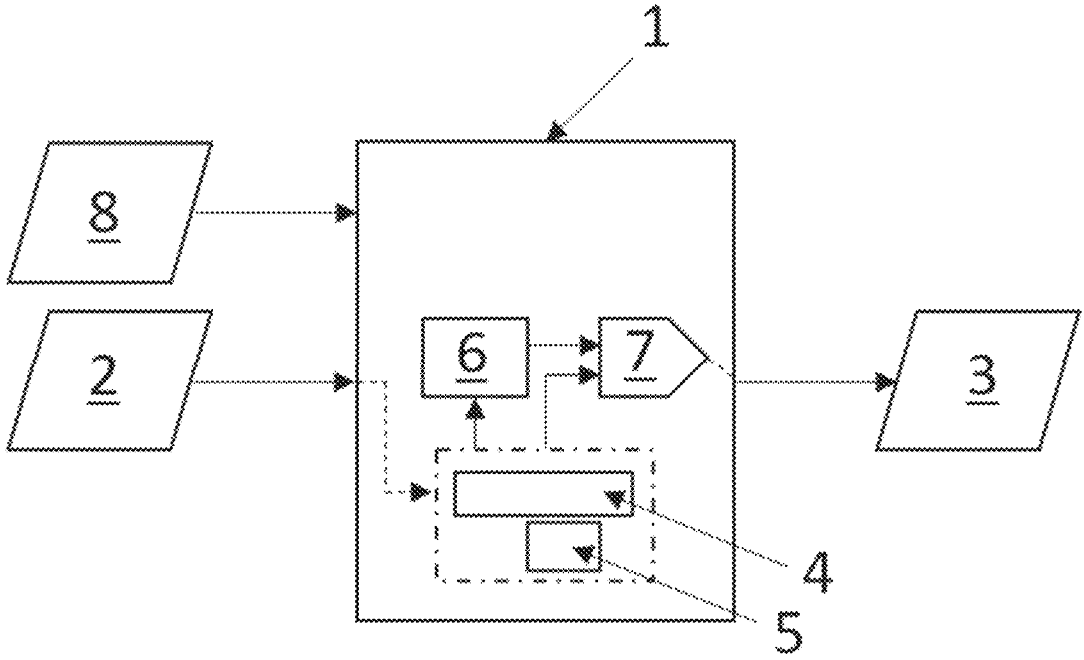
FIG. 1 shows a schematic and illustrative depiction of an embodiment of the N-bit digital-to-analogue converter according to the invention.

FIG. 1 shows a schematic and illustrative depiction of an embodiment of the N-bit digital-to-analogue converter 1 according to the invention. Overall, the N-bit digital-to-analogue converter 1 is configured to receive digital data 2 as input and to provide as output an output voltage 3. The N-bit digital-to-analogue converter 1 comprises a output data register 4 with at least N bits, and M enhancement bits 5. In FIG. 1, the M enhancement bits 5 are drawn separate from the output data register 4; the M enhancement bits 5 could be provided through the output data register 4 itself or through a separate enhancement register. The output voltage range of the N-bit digital-to-analogue converter 1 depends on the voltage reference 8, and N bits in the output data register 4 may represent the output voltage range.

When receiving digital data 2 as input, the N-bit digital-to-analogue converter 1 is configured to store them in the output data register 4 and in the M enhancement bits. The N-bit digital-to-analogue converter 1 further comprises an evaluation logic 6 which may operate on the at least one register, specifically the output data register 4 and the M enhancement bits 5. The evaluation logic 6 is configured to provide at least one binary evaluation signal derived from the received digital data 2 stored in the output data register 4 and in the M enhancement bits 5.

Through a converter 7 of the N-bit digital-to-analogue converter 1, the output voltage 3 is provided. The converter 7 may comprise an R-2R ladder network, for example. For creating the output voltage 3, besides N bits of the output data register 4, the converter 7 also takes into account the at least one binary evaluation signal provided by the evaluation logic 6.

Figure 2:
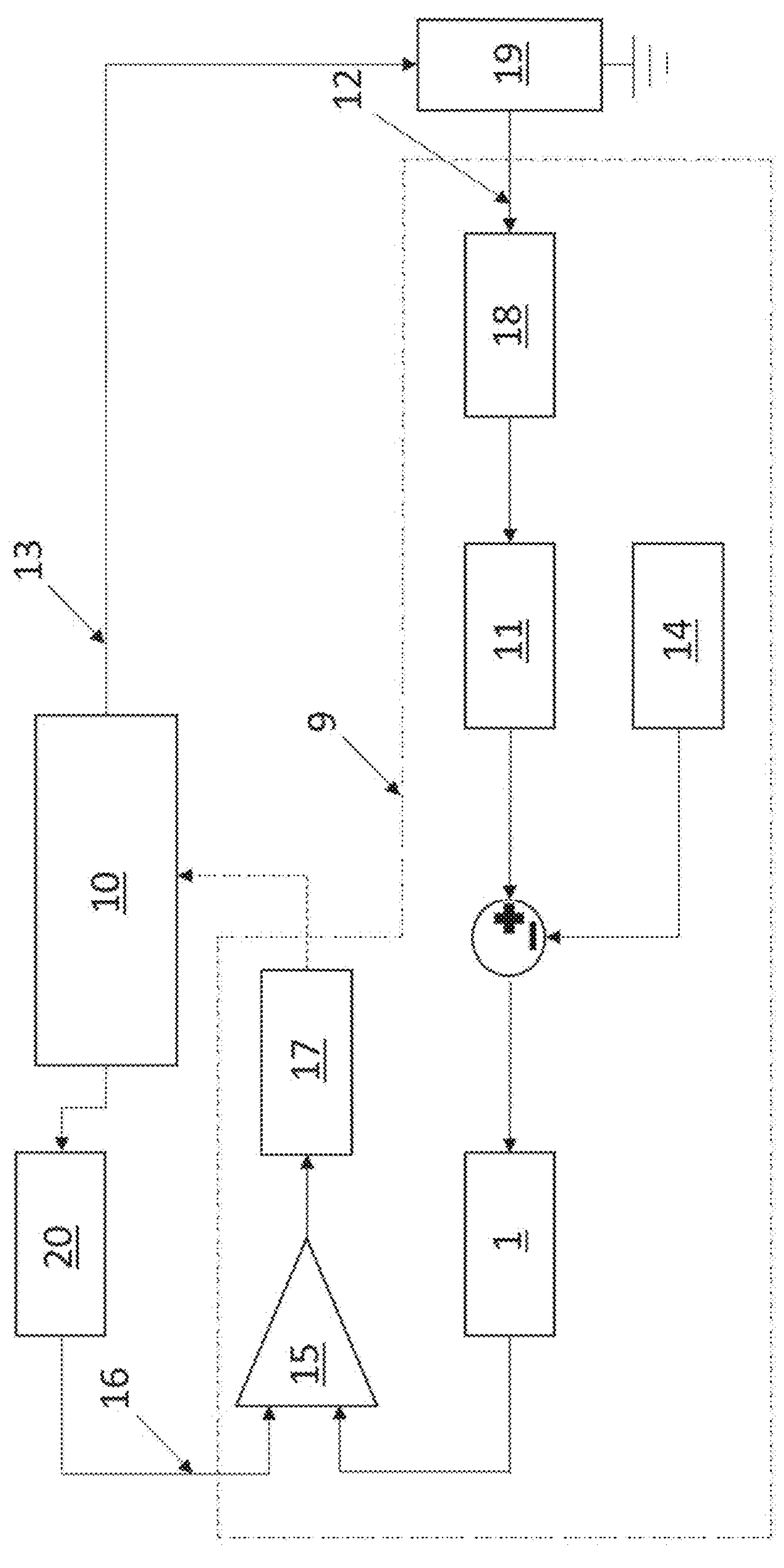
FIG. 2 shows a schematic and illustrative depiction of a switched-mode power supply and a mixed-signal microcontroller for current mode control of the switched-mode power supply.

FIG. 2 shows a schematic and illustrative depiction of a switched-mode power supply 10 and a mixed-signal microcontroller 9 for current mode control of the switched-mode power supply 10. The switched-mode power supply 10 may be embodied as a Buck converter, or as a Boost converter, or as a Buck-Boost converter, for example. In the embodiment of FIG. 2, the switched-mode power supply 10 is controlled by the mixed-signal microcontroller 9 by suitably turning on and off switches of the switched-mode power supply 10.

In FIG. 2, the voltage source of the switched-mode power supply 10 is not explicitly shown, but is included in the abstract representation of the switched-mode power supply 10. The power supply output voltage 13 of the switched-mode power supply 10 is provided to a voltage divider 19 that is configured to adapt the voltage range of the power supply output voltage 13 to the voltage range accepted by an analogue-to-digital converter 18 of the mixed-signal microcontroller 9. The mixed-signal microcontroller 9 is thereby provided with a voltage sense signal 12.

To carry out current mode control of the switched-mode power supply 10, the mixed-signal microcontroller 9 is provided with the voltage sense signal 12 and a current sense signal 16, which current sense signal 16 is based on a current through the switched-mode power supply 10. The current sense signal 16 is measured by a current sensor 20, for example embodied as a resistor or current transformer.

As shown in FIG. 2, there exists both an inner current control loop and an outer voltage control loop. In the outer voltage control loop, the voltage sense signal 12 is first sampled by the analogue-to-digital converter 18 and then digitally filtered by the compensation control logic 11. The compensation control logic 11 may implement a two-pole two-zero compensator, for example. To avoid the occurrence of subharmonic oscillations, the slope compensation logic 14 provides a series of digital slope compensation values that may be subtracted from, as shown in FIG. 2, or added to the series of digital compensation control values provided by the compensation control logic 11. The design of the digital slope compensation values is known in the prior art.

The N-bit digital-to-analogue converter 1 of the mixed-signal microcontroller 9 next receives digital data as input, which digital data is formed through subtraction or addition between the series of digital compensation control values and the series of digital slope compensation values, and provides output voltages to a comparator 15 of the mixed-signal microcontroller 9, which comparator 15 also receives as input the current sense signal 16: through the comparator 15 and the subsequent drive control logic 17, the inner current control loop is formed. The drive control logic 17 typically comprise a pulse-width modulation controller. When the current sense signal 16 becomes equal to the output voltage provided by the N-bit digital-to-analogue converter 1, the pulse-width modulation controller may turn off a switch in the switched-mode power supply 10, for example.

Figure 3A:
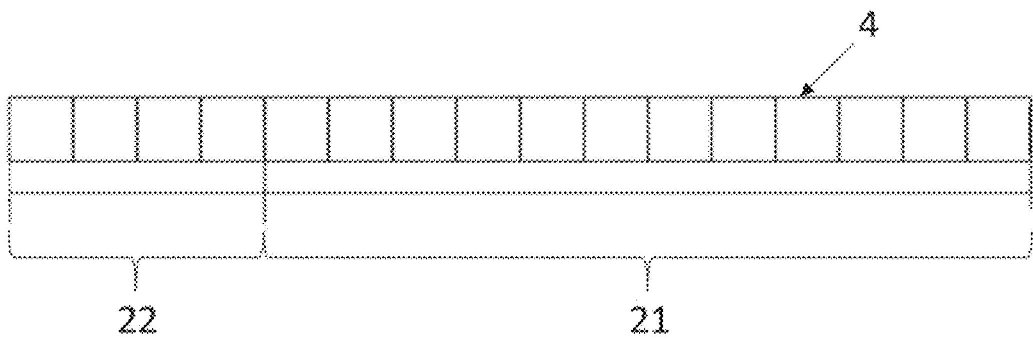
FIG. 3A and FIG. 3B show a schematic and illustrative depiction of two embodiments of registers of the N-bit digital-to-analogue converter according to the invention.
Figure 3B:
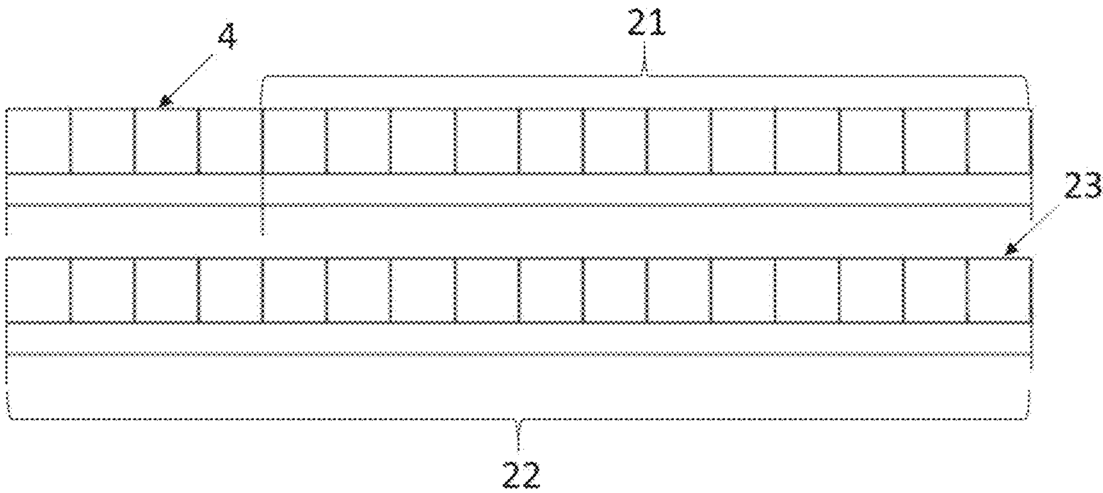

FIG. 3A and FIG. 3B show a schematic and illustrative depiction of two embodiments of registers of the N-bit digital-to-analogue converter according to the invention.

In FIG. 3A, the output data register 4 comprises both (i) N bits 21 that may be converted into an output voltage 3 by the converter 7 of the N-bit digital-to-analogue converter 1, and (ii) the M enhancement bits 22. Registers in conventional digital-to-analogue converter often comprise unused bits. In FIG. 3A, such unused bits are used for the M enhancement bits 22. The M enhancement bits 22 are appended continuously to the N bits 21.

In FIG. 3B, the output data register 4 comprises N bits 21 as well as unused bits, while the M enhancement bits 22 are provided by a separate enhancement register 23. Compared to the embodiment of FIG. 3A, the embodiment of FIG. 3B offers improved processing freedom as processing of the two registers may be carried out independently from each other.

In peak current mode control of a switched-mode power supply 10, for example, the embodiment of FIG. 3A may be used to perform down-slope compensation, while the embodiment of FIG. 3B may be used to perform down-slope compensation or up-slope compensation.

Figure 4:
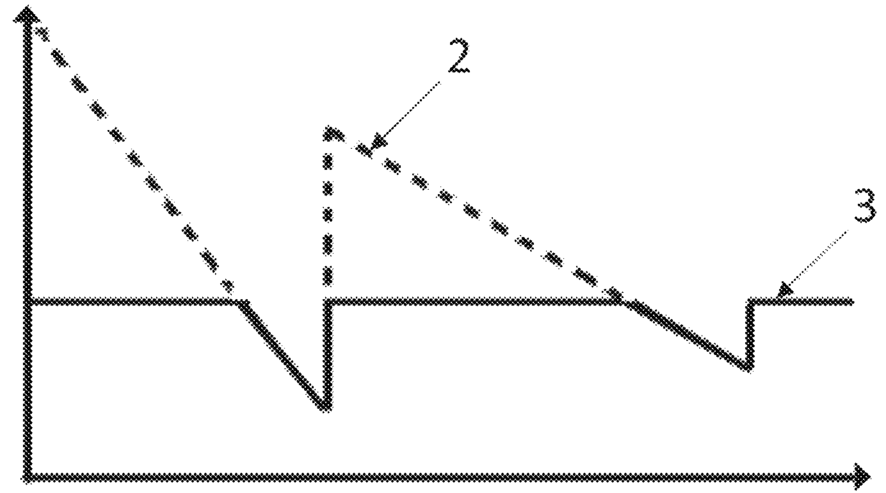
FIG. 4 shows a schematic and illustrative depiction of an exemplary relation between an input and output of the N-bit digital-to-analogue converter according to the invention.

FIG. 4 shows a schematic and illustrative depiction of an exemplary relation between an input and output of the N-bit digital-to-analogue converter 1. The N-bit digital-to-analogue converter 1 receives digital data 2 as input and converts them into an analogue output voltage 3. As indicated in FIG. 4 by the dashed lines representing the digital data 2, the digital data 2 may represent an analogue range of values that is larger than the output voltage range of the N-bit digital-to-analogue converter 1.

To obtain the output voltage 3 of FIG. 4, the evaluation logic 6 of the N-bit digital-to-analogue converter 1 compares the digital data 2 stored in the output data register 4 and in the M enhancement bits 5 to a threshold, which threshold may be configurable and which threshold either corresponds to the maximum output voltage of the N-bit digital-to-analogue converter 1 or to an intermediate voltage in the output voltage range of the N-bit digital-to-analogue converter 1. In case the currently considered digital data 2 are larger than the threshold, the output of the N-bit digital-to-analogue converter 1 is clamped to an output voltage corresponding to the threshold, and in case the currently considered digital data 2 is smaller than or equal to the threshold, the output of the N-bit digital-to-analogue converter 1 corresponds to the currently considered digital data 2.

Instead of clamping digital data that is larger than a threshold, digital data that is smaller than a threshold may be clamped as well to an output voltage corresponding to the threshold. The evaluation logic 6 of the N-bit digital-to-analogue converter 1 may also use a plurality of thresholds.

Figure 5A:
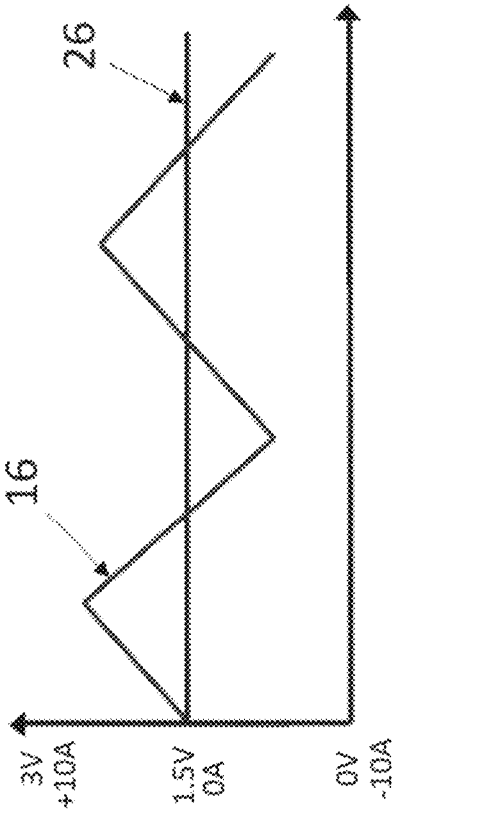
FIG. 5A, FIG. 5B and FIG. 5C show a schematic and illustrative depiction of the use of thresholding in an N-bit digital-to-analogue converter according to the invention.
Figures 5B, 5C:
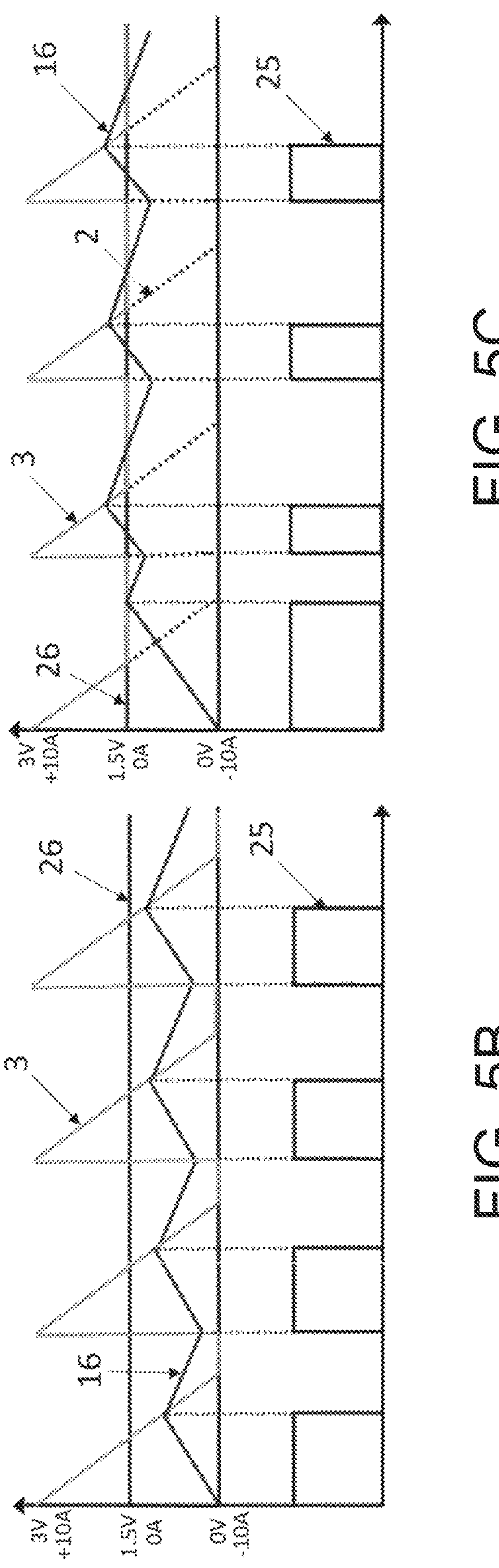

FIG. 5A, FIG. 5B and FIG. 5C show a schematic and illustrative depiction of the use of thresholding in an N-bit digital-to-analogue converter 1 used for current mode control of a switched-mode power supply 10. In FIG. 5A, the current sense signal 16 of a current sensor 20 is shown, which current sensor 20 provides a current sense signal 16 shifted by an offset 26, the offset in the example of FIGS. 5A-5C being 1.5 V. In the embodiment of FIGS. 5A-5C, the current sensor 20 may map a current of 0 A to 1.5 V, a current of 10 A to 3 V and a current of −10 A to 0 V, for example.

The result of using such a current sensor 20 in current mode control without thresholding is shown in FIG. 5B, while the result of using such a current sensor 20 in current mode control with thresholding is shown in FIG. 5C. In both FIG. 5B and FIG. 5C, the current sense signal 16 based on a current through an inductor of the switched-mode power supply 10 is shown, as well as the pulse-width modulation signal 25 that controls whether the switch of the switched-mode power supply 10 is turned on or off.

As shown in FIG. 5B and FIG. 5C, the switch of the switched-mode power supply 10 is turned off when the current sense signal 16 is equal to the output voltage 3 of the N-bit digital-to-analogue converter. Thereafter, current starts decreasing. Due to the type of current sensor 20 being used, without thresholding as shown in FIG. 5B, the current through the switched-mode power supply 10 cannot build up sufficiently, thereby hampering performance of the switched-mode power supply 10.

With an inventive N-bit digital-to-analogue converter 1, this problem may be remedied: in case the evaluation logic 6 of the N-bit digital-to-analogue converter 1 is configured to clamp its output voltage 3 to the offset 26 of the current sensor 20 in case the received digital data 2 is smaller than a value corresponding to the offset 26, current through the switched-mode power supply 10 can build up sufficiently. As shown in FIG. 5C, due to the thresholding, the duty cycle indicated by the pulse-width modulation signal 25 may change during operation of the switched-mode power supply 10.

Figure 6B:
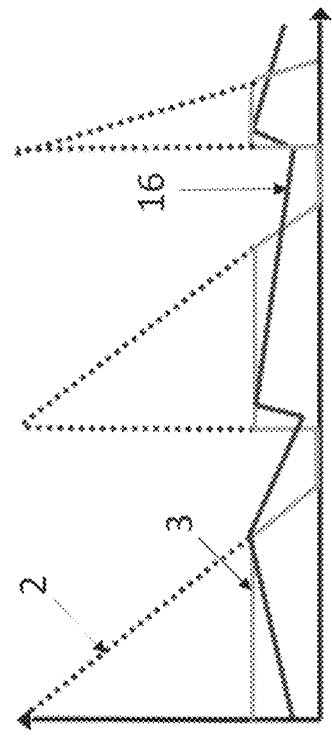
FIG. 6A and FIG. 6B show a schematic and illustrative depiction of the use of thresholding in an N-bit digital-to-analogue converter according to the invention for protection of a switched-mode power supply.
Figure 6A:
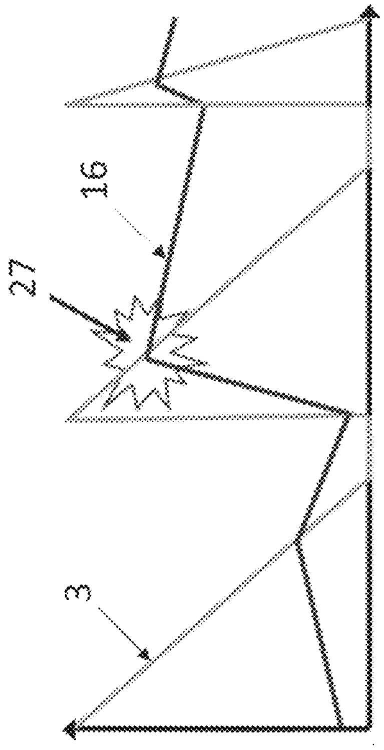

FIG. 6A and FIG. 6B show a schematic and illustrative depiction of the use of thresholding in an N-bit digital-to-analogue converter for protection of a switched-mode power supply 10. In case of a rapid change in the input voltage of the switched-mode power supply 10, as indicated in FIG.

6A, current through the switched-mode power supply 10 may rise rapidly, the current being represented by the current sense signal 16. If no thresholding is employed, a large current 27 may result which may cause destruction of the switched-mode power supply 10.

Using an inventive N-bit digital-to-analogue converter 1 as shown in FIG. 6B, digital data 2 which are larger than a threshold may be clamped to an output voltage 3 in the output voltage range of the N-bit digital-to-analogue converter 1. As indicated in FIG. 6B, this way the rise of the current due to an abruptly changed input voltage may be stopped earlier as the current sense signal 16 corresponding to the current would reach the output voltage 3 of the N-bit digital-to-analogue converter 1 earlier, thereby causing the mixed-signal microcontroller 9 to turn off the switch of the switched-mode power supply 10 earlier.

The solution of the invention is specified by the features of various embodiments of the invention. The invention relates to an N-bit digital-to-analogue converter with an output voltage range between a minimum output voltage and a maximum output voltage and with N being a positive integer, wherein the N-bit digital-to-analogue converter is configured to provide as output an output voltage based on digital data received as input, wherein the N-bit digital-to-analogue converter comprises

- at least one register, with the at least one register comprising an output data register having at least N bits and with the at least one register further comprising M enhancement bits, with M being a positive integer, wherein the N-bit digital-to-analogue converter is configured to store the received digital data in the output data register and in the M enhancement bits;
- an evaluation logic configured to provide at least one binary evaluation signal derived from the received digital data stored in the output data register and in the M enhancement bits, with each binary evaluation signal of the at least one binary evaluation signal having as possible values respectively a first binary evaluation signal value and a second binary evaluation signal value; and
- a converter configured to receive the at least one binary evaluation signal, with the converter having access to the output data register and being configured to provide the output voltage based on the output data register and the received at least one binary evaluation signal.

The N-bit digital-to-analogue converter (N-bit DAC) is configured to map digital input values into analogue output values, which analogue output values lie in an output voltage range between a minimum output voltage and a maximum output voltage. The output voltage range for example may be between ground and a voltage reference $V_{REF}$, or the output voltage range may be between a negative voltage reference $-V_{REF}$ and the voltage reference $V_{REF}$. The N-bit DAC is configured to map digital signals encoded in N bits into the output voltage range, e.g. through equidistant spacing of the $2^N$ possible digital signals encoded by the N bits within the output voltage range, which output voltage range may be, for example, between 0V and $$\frac{(2^N - 1)V_{REF}}{2^N}.$$

The actual output voltage is provided through the converter of the N-bit DAC, which converter may comprise an R-2R ladder network for mapping digital signals into analogue values, for example. The converter may, however, also comprise different means than R-2R ladder networks as known in the prior art for mapping digital signals into analogue output voltages.

The N-bit DAC comprises at least one register. The at least one register comprises an output data register having at least N bits. The at least one register also comprises M enhancement bits. As an example of a further possible register, the N-bit DAC may comprise a shift register. The N-bit DAC may comprise an input pin through which the N-bit DAC may receive serial input data, which serial input data may comprise the digital data received as input, for example. Besides the digital data, the serial input data may comprise further information to control behaviour of the N-bit DAC. The N-bit DAC may also comprise another input pin through which the N-bit DAC may receive a clock signal, which clock signal may determine timing of the N-bit DAC. When receiving the serial input data, the N-bit DAC may first store the received serial input data in the shift register. The N-bit DAC may for example be such that the received serial input data is moved to the shift register on each rising clock edge. Through other trigger signals received by the N-bit DAC through further dedicated input pins, for example, data stored in the shift register may be latched into the output data register and the M enhancement bits. Other implementations for moving the received digital data into the output data register and the M enhancement bits are feasible as well, however.

The at least one register may comprise an enhancement register different from the output data register, which enhancement register may comprise the M enhancement bits. Alternatively, the output data register may comprise the M enhancement bits, i.e. the output data register may comprise at least N+M bits. Having a separate enhancement register that is different from the output data register may provide greater freedom of data processing as the digital data in the enhancement register may be independently changed, for example incremented or decremented, from the digital data in the output data register. In both cases, however, the output data register and the M enhancement bits provide a space for storing binary data on which the evaluation logic of the N-bit DAC may operate, i.e. on which space computation may take place. The output data register and the M enhancement bits may enable an internal representation of an enlarged range of values on which computation may be carried out as compared to the range encoded by the N bits that are converted into the output voltage by the converter.

The output data register and the M enhancement bits on one side and the converter on the other side may be configured such that the digital data stored in the output data register and the M enhancement bits is not directly converted into analogue output voltages by the converter. Instead, the at least one register of the N-bit DAC may comprise a converter register comprising N bits, for example, with the converter operating directly on the converter register, and with the binary data stored in the converter register being used for opening or closing switches of an R-2R ladder network of the converter, for example. The binary data stored in such a converter register may depend on both the digital data stored in the output data register and on the at least one binary evaluation signal provided by the evaluation logic. In case such a converter register is present, the converter may comprise control logic configured to write binary data into the converter register based on the at least one binary evaluation signal and the digital data stored in the output data register.

Alternatively, the converter may also directly operate on the digital data stored in the output data register, i.e. the converter register may not be present. In this case, the converter may comprise control logic which takes into account both the digital data stored in N bits of the output data register and the at least one binary evaluation signal for setting switches of an R-2R ladder network of the converter, for example.

Each binary evaluation signal of the at least one binary evaluation signal abstractly corresponds to a binary decision on whether a property is fulfilled or is not fulfilled by the digital data stored in the output data register and in the M enhancement bits. A possible binary decision is whether the stored digital data is smaller or larger than a threshold, for example. Each binary evaluation signal may therefore have two possible binary evaluation signal values, with one of the two possible values encoding that the stored digital data does not fulfil the property and with the other of the two possible values encoding that the stored digital data fulfils the property. A property may be memoryless, i.e. whether or not the stored digital data processed by the evaluation logic fulfils the respective property may be treated independently of whether previously stored digital data fulfilled the respective property or not. The evaluation logic may also use time-dependent properties, however, i.e. whether or not the stored digital data processed by the evaluation logic fulfils the respective property may depend on whether previously stored digital data fulfilled the respective property or not. For being able to handle such time-dependent properties, the N-bit DAC may comprise an internal storage in which binary evaluation signals may be stored.

Advantageously, the inventive N-bit DAC may therefore receive digital data as input which may not be represented by the N bits, which N bits, together with the output voltage range, may define the output resolution of the N-bit DAC. Through the at least one binary evaluation signal, however, information about the received digital data may be determined and used for potentially influencing the output voltage of the N-bit DAC.

In an embodiment of the N-bit digital-to-analogue converter according to the invention, the minimum output voltage and the maximum output voltage depend on a voltage reference provided to the N-bit digital-to-analogue converter.

In a further embodiment of the N-bit digital-to-analogue converter according to the invention, the number M of enhancement bits is configurable. Advantageously, the range of digital data which may be received as input by the N-bit DAC may thereby be configurable.

In a further embodiment of the N-bit digital-to-analogue converter according to the invention, each binary evaluation signal of the at least one binary evaluation signal is related to a corresponding threshold, wherein the evaluation logic is configured to (i) provide each binary evaluation signal of the at least one binary evaluation signal by comparing the digital data stored in the output data register and in the M enhancement bits to the corresponding threshold and to (ii) subsequently set the binary evaluation signal to the first binary evaluation signal value or to the second binary evaluation signal value based on the comparison.

In a further embodiment of the N-bit digital-to-analogue converter according to the invention, the output data register comprises the M enhancement bits, with the M enhancement bits being continuously appended to the N bits so that the output data register comprises N+M bits for storing the received digital data. The maximum value that thus may be stored in the N+M bits may be $2^{N+M}-1$.

In a further embodiment of the N-bit digital-to-analogue converter according to the invention, the evaluation logic is configured to provide a first binary evaluation signal, with the corresponding first threshold being configurable or being equal to $2^N-1$, and the converter is configured to (i) provide an output voltage corresponding to the configurable first threshold or to $2^N-1$ in case the digital data stored in the output data register and in the M enhancement bits is larger than the configurable first threshold or than $2^N-1$ and to (ii) provide an output voltage based on the digital data stored in the output data register in case the stored digital data is smaller than or equal to the configurable first threshold or to $2^N-1$.

In a further embodiment of the N-bit digital-to-analogue converter according to the invention, the evaluation logic is configured to provide a second binary evaluation signal, with the corresponding second threshold being configurable while being smaller than the first threshold, and wherein the converter is configured to (i) provide an output voltage corresponding to the configurable second threshold in case the digital data stored in the output data register and in the M enhancements bits is smaller than the configurable second threshold and to (ii) provide an output voltage corresponding to the digital data stored in the output data register in case the stored digital data is greater than or equal to the configurable second threshold.

In a further embodiment of the N-bit digital-to-analogue converter according to the invention, the at least one register comprises an enhancement register, which enhancement register comprises the M enhancement bits.

In a second aspect, the invention relates to a mixed-signal microcontroller for current mode control of a switched-mode power supply, wherein the mixed-signal microcontroller comprises (i) a compensation control logic configured to provide a series of digital compensation control values derived from a voltage sense signal, with the voltage sense signal being based on a power supply output voltage of the switched-mode power supply, (ii) a slope compensation logic configured to provide a series of digital slope compensation values, with the series of digital slope compensation values being adapted to the switched-mode power supply, (iii) an N-bit digital-to-analogue converter according to the invention, with the N-bit digital-to-analogue converter configured to receive as input the series of digital compensation control values and the series of digital slope compensation values and to provide as output a control voltage signal, (iv) a comparator, wherein the comparator is configured to compare the control voltage signal to a voltage of a current sense signal, with the current sense signal being based on a current through the switched-mode power supply, and to provide as output a comparator voltage signal, and (v) a drive control logic, wherein the drive control logic is configured to receive as input the comparator voltage signal and to provide as output a drive signal for a switch of the switched-mode power supply.

Current mode control, for example realised as peak current mode control, valley current mode control or emulated current mode control, is a well-known technique used for controlling switched-mode power supplies. A known problem in current mode control of switched-mode power supplies is the occurrence of sub-harmonic oscillations that manifest themselves in alternating wide and narrow pulses. To prevent such sub-harmonic oscillations from occurring, slope compensation is a known technique from the prior art. Current mode control may in general be realised as analogue current mode control or digital current mode control. The mixed-signal microcontroller of the second aspect is designed for digital current mode control.

The mixed-signal microcontroller is configured to control switching behaviour of switches of the switched-mode power supply through its drive control logic. For this purpose, the mixed-signal microcontroller may comprise a pulse-width modulation controller. In case the switched-mode power supply is embodied as a Buck converter, for example, the ratio between the power supply output voltage of the Buck converter to its input voltage ideally corresponds to the duty cycle at which the switch of the Buck converter is operated. Assuming the Buck converter does not comprise a second switch for synchronous rectification but only a diode, the single switch of the Buck converter may be controlled by the mixed-signal microcontroller. This switch may be periodically turned on, thereby enabling current flow through the switch, at a switching frequency. Once the switch is turned on, current through the inductor of the Buck converter starts increasing. Within each switching period, the mixed-signal microcontroller is configured to determine the time at which the switch shall be turned off: current through the inductor of the Buck converter then starts decreasing. More generally, for other type of switched-mode power supplies as well, a switch of the switched-mode power supply may also be periodically turned on at a switching frequency and later turned off during each switching period by the mixed-signal microcontroller.

During steady state operation of the switched-mode power supply, the slope compensation logic may provide the digital slope compensation values in the form of a periodically repeating compensating ramp signal, wherein the slope compensation period of the compensating ramp signal may ideally be close to the switching period of the switched-mode power supply. In general, the type of slope compensation to be used (possible parameters to be set include, inter alia, height of the compensating ramp signal, number of steps per slope compensation period, use of an up-slope or down-slope, duration of a slope compensation period etc.) may depend on the type of switched-mode power supply, on how the switched-mode power supply is to be operated and on the type of current mode control to be used. The configuration of the slope compensation logic is well known from the prior art.

For a Buck converter for which analogue peak current mode control is used, for example, the slope of the analogue compensation signal may be set based on the down-slope of the current through the inductor of the Buck converter, i.e. it may be proportional to the ratio between the power supply output voltage, i.e. the output voltage of the Buck converter, and the inductance of the inductor of the Buck converter. Similarly, for a Boost converter for which analogue peak current mode control is used, for example, the slope of the analogue compensation signal may be set to be proportional to the ratio between (i) the difference between the power supply output voltage, i.e. the output voltage of the Boost converter, and the input voltage of the Boost converter, and (ii) the inductance of the inductor of the Boost converter. Similarly, for a Buck-Boost converter for which analogue peak current control is used, for example, the slope of the analogue compensation signal may be set to be proportional to the ratio between the power supply output voltage, i.e. the output voltage of the Buck-Boost converter, and the inductance of the inductor of the inductor of the Buck-Boost converter. Summarising, for the Buck converter, the Boost converter and the Buck-Boost converter, in case of analogue peak current mode control, the slope of the compensation signal may be set based on the down-slope of the current through the inductor of the respective converter. In case of controlling the Buck converter, the Boost converter or the Buck-Boost converter with analogue valley current mode control, for example, the slope of the compensation signal may be set based on the up-slope of the current through the inductor of the respective converter.

For digital current mode control, instead of these analogue compensation signals, functionally equivalent digital slope compensation values may be provided by the slope compensation logic, which digital slope compensation values may be subtracted from or added to the digital compensation control values. The digital compensation control values may be provided by the compensation control logic at a rate corresponding to the switching frequency of the switched-mode power supply; for a slope compensation period that is smaller than or equal to the switching period, the sequence of steps per slope compensation period may be provided at a higher frequency than the switching frequency and the corresponding clock signal may be provided to the N-bit digital-to-analogue converter as well.

In case the switched-mode power supply is embodied as a Buck converter and the mixed-signal microcontroller is configured to carry out digital peak current mode control, for example, at the N-bit digital-to-analogue converter of the mixed-signal microcontroller, the following operations may be carried out in each switching period: at a beginning of the switching period, a digital compensation control value of the series of digital compensation control values may be provided to the N-bit digital-to-analogue converter and stored in the output data register and in the M enhancement bits. Next, the digital slope compensation values may be one after the other subtracted from the stored digital compensation control value before a next digital compensation control value is provided to the N-bit digital-to-analogue converter; accordingly, the stored digital compensation control value may be gradually decremented.

The N-bit digital-to-analogue converter provides as output a control voltage signal.

Further continuing with the example in which the switched-mode power supply is embodied as a Buck converter and the mixed-signal microcontroller is configured to carry out digital peak current mode control, the comparator of the mixed-signal microcontroller is configured to compare a current sense signal with the control voltage signal. In present example, the current sense signal is based on a peak of the current through the inductor of the Buck converter. To obtain the current sense signal, a resistor or a current transformer may be used, for example. The current sense signal may be provided as input to the mixed-signal microcontroller. Based on the result of this comparison, i.e. the comparator voltage signal, a drive signal for driving the switch of the Buck converter may be determined by the drive control logic of the mixed-signal microcontroller.

For typical operational conditions of a Buck converter, Boost converter or Buck-Boost converter controlled with analogue peak current mode control, for example, the current sense signal may be confined to a narrower range of possible values than the range of values that the analogue compensation signal for analogue slope compensation would traverse within one switching period. The N-bit digital-to-analogue converter of the mixed-signal microcontroller may accordingly be embodied in such a way that the N bits of the N-bit digital-to-analogue converter do not represent the range of values that the analogue compensation signal would traverse within one switching period, but may instead represent the narrower range of the current sense signal, while the N+M bits provided by the output data register together with the M enhancement bits may represent the larger range of values which the analogue compensation signal would traverse within one switching period. Advantageously, the N-bit digital-to-analogue converter of the invention as part of the mixed-signal microcontroller may thereby improve resolution in the narrower range of possible values of the current sense signal, which narrower range of possible values is relevant for the subsequent comparison between the control voltage signal and the current sense signal, while retaining the ability to process values from the larger range of values which the analogue compensation signal would traverse within one switching period. If instead of the N-bit digital-to-analogue converter according to the invention a conventional N-bit digital-to-analogue converter were used, resolution in the relevant range for current mode control would be lower as the N bits would be used for representing the larger range of values which the analogue compensation signal would traverse within one switching period.

For a Buck converter with analogue peak current mode control, for example, the evaluation logic of the N-bit digital-to-analogue converter may provide one binary evaluation signal: if the currently stored digital data in the output data register and the M enhancement bits, which currently stored digital data corresponds to the gradually decremented digital compensation control values, is larger than $2^N-1$, the converter of the N-bit digital-to-analogue converter may provide as output voltage the maximum output voltage; if the currently stored digital data in the output data register and the M enhancement bits is smaller than or equal to $2^N-1$, the converter of the N-bit digital-to-analogue converter may provide as output voltage a voltage in the output voltage range corresponding to the currently stored digital data.

The power supply output voltage of the switched-mode power supply may be provided via a voltage divider to the mixed-signal microcontroller, which mixed-signal microcontroller may comprise an analogue-to-digital converter that samples the fraction of the power supply output voltage provided by the voltage divider. The sampled values may then be provided to a digital filter which digital filter in turn may output the digital compensation control values.

Using a mixed-signal microcontroller for current mode control of a switched-mode power supply may advantageously also enable the use of current sensors for sensing the current in the switched-mode power supply, which current sensors having an offset in their output voltages. Using a mixed-signal microcontroller for current mode control of a switched-mode power supply may advantageously also enable an improved protection of the switched-mode power supply against rapid increases of current in the switched-mode power supply.

In an embodiment of the mixed-signal microcontroller, the mixed-signal microcontroller further comprises an analogue-to-digital converter configured to receive the voltage sense signal as input and to provide as output a digital voltage sense signal to the compensation control logic, and/or the drive control logic comprises a pulse-width modulation controller.

In a further embodiment of the mixed-signal microcontroller, the series of digital slope compensation values are provided in the form of a periodically repeating compensating ramp signal, wherein for each digital compensation control value of the series of digital compensation control values, the microcontroller is configured to load the digital compensation control value into the output data register and the M enhancement bits and to subsequently adapt the loaded digital compensation control value by adding or subtracting the digital slope compensation values of one period of the compensating ramp signal to or from the loaded digital compensation control value before loading a subsequent digital compensation control value of the series of digital compensation control values into the output data register and the M enhancement bits.

In a further embodiment of the mixed-signal microcontroller, the evaluation logic of the N-bit digital-to-analogue converter is configured to provide the at least one binary evaluation signal after each adaptation of the loaded digital compensation control value.

Instead of providing the at least one binary evaluation signal after each adaptation of the loaded digital compensation control value, the at least one binary evaluation signal may also only be provided for a subset of the adapted loaded digital compensation control values.

In a further embodiment of the mixed-signal microcontroller, the mixed-signal microcontroller is configured for peak current mode control, wherein the slope compensation logic is configured to provide a compensating ramp signal with a slope based on a down-slope of an inductor current through an inductor of the switched-mode power supply.

In a further embodiment of the mixed-signal microcontroller, the mixed-signal microcontroller is configured for valley current mode control, wherein the slope compensation logic is configured to provide a compensating ramp signal with a slope based on an up-slope of an inductor current through an inductor of the switched-mode power supply, and wherein the at least one register of the N-bit digital-to-analogue converter comprises an enhancement register, which enhancement register comprises the M enhancement bits.

An N-bit digital-to-analogue converter according to the invention with a separate enhancement register may provide processing flexibility as the enhancement register may be incremented or decremented independently from the output data register.

In a further embodiment of the mixed-signal microcontroller, the mixed-signal microcontroller is configured for current mode control of a buck converter, or for current mode control of a boost converter, or for current mode control of a buck-boost converter.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An N-bit digital-to-analogue converter with an output voltage range between a minimum output voltage and a maximum output voltage and with N being a positive integer, wherein the N-bit digital-to-analogue converter is configured to provide as output an output voltage based on digital data received as input, wherein the N-bit digital-to-analogue converter comprises:

- at least one register, with the at least one register comprising an output data register having at least N bits and with the at least one register further comprising M enhancement bits, with M being a positive integer, wherein the N-bit digital-to-analogue converter is configured to store the received digital data in the output data register and in the M enhancement bits;

an evaluation logic configured to provide at least one binary evaluation signal derived from the received digital data stored in the output data register and in the M enhancement bits, with each binary evaluation signal of the at least one binary evaluation signal having as possible values respectively a first binary evaluation signal value and a second binary evaluation signal value; and a converter configured to receive the at least one binary evaluation signal, with the converter having access to the output data register and being configured to provide the output voltage based on the output data register and the received at least one binary evaluation signal.

2. The N-bit digital-to-analogue converter according to claim 1, wherein the minimum output voltage and the maximum output voltage depend on a voltage reference provided to the N-bit digital-to-analogue converter.

3. The N-bit digital-to-analogue converter according to claim 1, with the number M of enhancement bits being configurable.

4. The N-bit digital-to-analogue converter according to claim 1, wherein each binary evaluation signal of the at least one binary evaluation signal is related to a corresponding threshold, wherein the evaluation logic is configured to (i) provide each binary evaluation signal of the at least one binary evaluation signal by comparing the digital data stored in the output data register and in the M enhancement bits to the corresponding threshold and to (ii) subsequently set the binary evaluation signal to the first binary evaluation signal value or to the second binary evaluation signal value based on the comparison.

5. The N-bit digital-to-analogue converter according to claim 4, wherein the output data register comprises the M enhancement bits, with the M enhancement bits being continuously appended to the N bits so that the output data register comprises N+M bits for storing the received digital data.

6. The N-bit digital-to-analogue converter according to claim 5, wherein the evaluation logic is configured to provide a first binary evaluation signal, with a corresponding first threshold being configurable or being equal to $2^N-1$, and wherein the converter is configured to (i) provide the output voltage corresponding to the configurable first threshold or to $2^N-1$ in case the digital data stored in the output data register and in the M enhancement bits is larger than the configurable first threshold or than $2^N-1$ and to (ii) provide the output voltage based on the digital data stored in the output data register in case the stored digital data is smaller than or equal to the configurable first threshold or to $2_N-1$.

7. The N-bit digital-to-analogue converter according to claim 6, wherein the evaluation logic is configured to provide a second binary evaluation signal, with a corresponding second threshold being configurable while being smaller than the first threshold, and wherein the converter is configured to (i) provide the output voltage corresponding to the configurable second threshold in case the digital data stored in the output data register and in the M enhancements bits is smaller than the configurable second threshold and to (ii) provide the output voltage corresponding to the digital data stored in the output data register in case the stored digital data is greater than or equal to the configurable second threshold.

8. The N-bit digital-to-analogue converter according to claim 4, wherein the at least one register comprises an enhancement register, which enhancement register comprises the M enhancement bits.

9. A mixed-signal microcontroller for current mode control of a switched-mode power supply, wherein the mixed-signal microcontroller comprises:

(i) a compensation control logic configured to provide a series of digital compensation control values derived from a voltage sense signal, with the voltage sense signal being based on a power supply output voltage of the switched-mode power supply;

(ii) a slope compensation logic configured to provide a series of digital slope compensation values, with the series of digital slope compensation values being adapted to the switched-mode power supply;

(iii) an N-bit digital-to-analogue converter configured to receive as input the series of digital compensation control values and the series of digital slope compensation values and to provide as output a control voltage signal based on the input, wherein N is a positive integer, the N-bit digital-to-analogue converter comprises at least one register, an evaluation logic and a converter, the at least one register comprises an output data register t least N bits and further comprises M enhancement bits, M is a positive integer, the N-bit digital-to-analogue converter is configured to store received digital data in the output data register and in the M enhancement bits, the evaluation logic is configured to provide at least one binary evaluation signal derived from the received digital data stored in the output data register and in the M enhancement bits, each binary evaluation signal of the at least one binary evaluation signal has as possible values respectively a first binary evaluation signal value and a second binary evaluation signal value, the converter is configured to receive the at least one binary evaluation signal, and the converter has access to the output data register and is configured to provide an output voltage based on the output data register and the received at least one binary evaluation signal;

(iv) a comparator, wherein the comparator is configured to compare the control voltage signal to a voltage of a current sense signal, with the current sense signal being based on a current through the switched-mode power supply, and to provide as output a comparator voltage signal; and (v) a drive control logic, wherein the drive control logic is configured to receive as input the comparator voltage signal and to provide as output a drive signal for a switch of the switched-mode power supply.

10. The mixed-signal microcontroller according to claim 9, wherein the series of digital slope compensation values are provided in the form of a periodically repeating compensating ramp signal, wherein for each digital compensation control value of the series of digital compensation control values, the mixed-signal microcontroller is configured to load the digital compensation control value into the output data register and the M enhancement bits and to subsequently adapt the loaded digital compensation control value by adding or subtracting the digital slope compensation values of one period of the compensating ramp signal to or from the loaded digital compensation control value before loading a subsequent digital compensation control value of the series of digital compensation control values into the output data register and the M enhancement bits.

11. The mixed-signal microcontroller according to claim 10, with the mixed-signal microcontroller being configured for peak current mode control, wherein the slope compensation logic is configured to provide a compensating ramp signal with a slope based on a down-slope of an inductor current through an inductor of the switched-mode power supply.

12. The mixed-signal microcontroller according to claim 10, with the mixed-signal microcontroller being configured for valley current mode control, wherein the slope compensation logic is configured to provide a compensating ramp signal with a slope based on an up-slope of an inductor current through an inductor of the switched-mode power supply, and wherein each binary evaluation signal of the at least one binary evaluation signal is related to a corresponding threshold, wherein the evaluation logic is configured to (i) provide each binary evaluation signal of the at least one binary evaluation signal by comparing the digital data stored in the output data register and in the M enhancement bits to the corresponding threshold and to (ii) subsequently set the binary evaluation signal to the first binary evaluation signal value or to the second binary evaluation signal value based on the comparison, and the at least one register comprises an enhancement register, which enhancement register comprises the M enhancement bits.

13. The mixed-signal microcontroller according to claim 9, further comprising an analogue-to-digital converter configured to receive the voltage sense signal as input and to provide as output a digital voltage sense signal to the compensation control logic (11), and/or wherein the drive control logic (17) comprises a pulse-width modulation controller.

14. The mixed-signal microcontroller according to claim 13, wherein the series of digital slope compensation values are provided in the form of a periodically repeating compensating ramp signal, wherein for each digital compensation control value of the series of digital compensation control values, the mixed-signal microcontroller is configured to load the digital compensation control value into the output data register and the M enhancement bits and to subsequently adapt the loaded digital compensation control value by adding or subtracting the digital slope compensation values of one period of the compensating ramp signal to or from the loaded digital compensation control value before loading a subsequent digital compensation control value of the series of digital compensation control values into the output data register and the M enhancement bits.

15. The mixed-signal microcontroller according to claim 14, with the mixed-signal microcontroller being configured for peak current mode control, wherein the slope compensation logic is configured to provide a compensating ramp signal with a slope based on a down-slope of an inductor current through an inductor of the switched-mode power supply.

16. The mixed-signal microcontroller according to claim 14, with the mixed-signal microcontroller being configured for valley current mode control, wherein the slope compensation logic is configured to provide a compensating ramp signal with a slope based on an up-slope of an inductor current through an inductor of the switched-mode power supply, and wherein each binary evaluation signal of the at least one binary evaluation signal is related to a corresponding threshold, wherein the evaluation logic is configured to (i) provide each binary evaluation signal of the at least one binary evaluation signal by comparing the digital data stored in the output data register and in the M enhancement bits to the corresponding threshold and to (ii) subsequently set the binary evaluation signal to the first binary evaluation signal value or to the second binary evaluation signal value based on the comparison, and the at least one register comprises an enhancement register, which enhancement register comprises the M enhancement bits.

17. The mixed-signal microcontroller according to claim 14, wherein the evaluation logic of the N-bit digital-to-analogue converter is configured to provide the at least one binary evaluation signal after each adaptation of the loaded digital compensation control value.

18. The mixed-signal microcontroller according to claim 17, with the mixed-signal microcontroller being configured for peak current mode control, wherein the slope compensation logic is configured to provide a compensating ramp signal with a slope based on a down-slope of an inductor current through an inductor of the switched-mode power supply.

19. The mixed-signal microcontroller according to claim 17, with the mixed-signal microcontroller being configured for valley current mode control, wherein the slope compensation logic is configured to provide a compensating ramp signal with a slope based on an up-slope of an inductor current through an inductor of the switched-mode power supply, and wherein each binary evaluation signal of the at least one binary evaluation signal is related to a corresponding threshold, wherein the evaluation logic is configured to (i) provide each binary evaluation signal of the at least one binary evaluation signal by comparing the digital data stored in the output data register and in the M enhancement bits to the corresponding threshold and to (ii) subsequently set the binary evaluation signal to the first binary evaluation signal value or to the second binary evaluation signal value based on the comparison, and the at least one register comprises an enhancement register, which enhancement register comprises the M enhancement bits.

20. The mixed-signal microcontroller according to claim 9, wherein the mixed-signal microcontroller is configured for current mode control of a buck converter, or for current mode control of a boost converter, or for current mode control of a buck-boost converter.

* * * * *